United States Patent
Chen et al.

(10) Patent No.: US 12,352,700 B1
(45) Date of Patent: Jul. 8, 2025

(54) MULTIPLE SUPERPOSITION DETECTION SYSTEM AND METHOD FOR CAPACITOR APPEARANCE DEFECTS BASED ON VISUAL DETECTION

(71) Applicant: Zhaoqing University, Zhaoqing (CN)

(72) Inventors: Rongrong Chen, Zhaoqing (CN); Shenglin He, Zhaoqing (CN); Liping Wang, Zhaoqing (CN); Zhenyu Lao, Zhaoqing (CN)

(73) Assignee: Zhaoqing University, Zhaoqing (CN)

( * ) Notice: Subject to any disclaimer, the term of this patent is extended or adjusted under 35 U.S.C. 154(b) by 0 days.

(21) Appl. No.: 18/931,084

(22) Filed: Oct. 30, 2024

(30) Foreign Application Priority Data

Apr. 22, 2024 (CN) .......................... 202410485241.3

(51) Int. Cl.
| | |
|---|---|
| *G01N 21/89* | (2006.01) |
| *G01N 21/95* | (2006.01) |
| *H01L 21/683* | (2006.01) |
| *G01N 35/00* | (2006.01) |

(52) U.S. Cl.
CPC ............ *G01N 21/89* (2013.01); *G01N 21/95* (2013.01); *H01L 21/683* (2013.01); *G01N 35/00* (2013.01); *G01N 2201/103* (2013.01)

(58) Field of Classification Search
CPC ........ G01N 21/89; G01N 21/88; G01N 21/95; H01L 21/68; H01L 21/683; H01L 21/95
See application file for complete search history.

(56) References Cited

FOREIGN PATENT DOCUMENTS

| CN | 105044114 B | * | 8/2018 |
| CN | 113070228 A | * | 7/2021 |
| CN | 215903381 U | * | 2/2022 |

OTHER PUBLICATIONS

CN 105044114 English translation (Year: 2018).*
CN 113070228 English translation (Year: 2021).*
CN 215903381 English translation (Year: 2022).*

* cited by examiner

*Primary Examiner* — Xanthia C Relford

(57) ABSTRACT

The disclosure provides a multiple superposition detection system and a multiple superposition detection method for capacitor appearance defects based on visual detection, relating to a capacitor detection field. The detection system includes a conveying mechanism, a visual detection mechanism, a loading mechanism, a sorting mechanism, a clamping mechanism and a clamping component; a driving mechanism is further arranged in the conveying mechanism. The capacitor is horizontally placed in the clamping mechanism of the conveying mechanism through the negative pressure pick-and-place mechanism, when the conveying mechanism drives the capacitor to sequentially penetrate through the three detection stations, the clamping mechanism is matched with the driving mechanism, and the front face and the side face of the capacitor are displayed to the visual detection mechanism. After detection, high-quality capacitors and defective capacitors are separately stored through the sorting mechanism.

3 Claims, 10 Drawing Sheets

MULTIPLE SUPERPOSITION DETECTION SYSTEM AND METHOD FOR CAPACITOR APPEARANCE DEFECTS BASED ON VISUAL DETECTION

TECHNICAL FIELD

The disclosure relates to the technical field of capacitor detection, and in particular to a multiple superposition detection system and a multiple superposition detection method for capacitor appearance defects based on visual detection.

BACKGROUND

Capacitor appearance detection equipment is a machine vision-based automated detection system. The capacitor appearance detection equipment converts the captured target into an image signal through a CCD industrial camera in a vision detection system, and the image signal is transmitted to a dedicated image processing system and then is transformed into digital signals based on information such as pixel distribution and brightness; the image system performs various calculations on these signals to extract target features, and then controls the on-site equipment to perform tasks such as visual detection, dimensional measurement, defect detection, and system positioning.

In the current process of capacitor appearance detection, although it is convenient to assist with defect detection through vision and image processing, however, the process still lacks the capability for the automated and efficient management of material loading and unloading. Additionally, there is no secondary guarantee for the reliability of the defect detection.

China patent with a publication number of CN116297482A relates to a capacitor appearance defect detection device based on machine vision and image processing, including a workbench, where mounting plates are arranged on both sides of the workbench, and a pushing mechanism is arranged on the mounting plate; the top of the pushing mechanism is provided with a detection mechanism; a motor I is installed on the upper surface of the workbench, the output end of the motor I is keyed with a driving shaft, the tail end of the driving shaft is provided with a working platform, the working platform is positioned below the detection mechanism, and an inner detection ring is arranged in the working platform.

This defect detection device uses the inner detection ring to set up a dual detection process, employing a camera to detect surface defects of stacked capacitors. However, it cannot detect whether there are defects on the sides of the capacitors, thus failing to effectively ensure the accuracy of the detection results.

SUMMARY

In view of the above problems, a multiple superposition detection system for capacitor appearance defects based on visual detection is provided. By horizontally positioning the capacitor within the clamping mechanism of the conveying mechanism, the clamping mechanism, in concert with the driving mechanism, enables the presentation of the capacitor's front, back, and side surfaces to the visual detection system as the conveying mechanism sequentially transports the capacitor through three detection stations in turn, thus effectively resolving the issue of conventional visual appearance detection devices being unable to efficiently inspect all surfaces of the capacitor.

In order to solve the problems in the prior art, a multiple superposition detection system for capacitor appearance defects based on visual detection is provided by the disclosure, including a conveying mechanism, where the conveying mechanism is sequentially provided with three detection stations and an unloading station along the conveying direction, each detection station is correspondingly provided with a visual detection mechanism, a feeding end of the conveying mechanism is provided with a loading mechanism, and the unloading station is provided with a sorting mechanism for collecting defective capacitors and high-quality capacitors respectively. Clamping mechanisms are sequentially arranged on the conveying surface of the conveying mechanism, and the clamping mechanisms are provided with clamping components capable of clamping a peripheral side of a capacitor in the horizontal direction, the clamping components are capable of facilitating the rotation of the capacitor along its width or length axis within the clamping mechanisms; the conveying mechanism is further provided with a driving mechanism for guiding the clamping components to drive the capacitor to sequentially rotate on the detection stations to expose the detection surfaces.

Optionally, the clamping component is provided with two sets of clamping jaws for releasably clamping the capacitor, and the clamping directions of the two sets of clamping jaws are perpendicular to each other in the horizontal direction.

Optionally, the clamping mechanism further includes a clamping table with a placement opening in the middle position, and clamping parts of the two sets of clamping jaws extend into the placement opening, the clamping distances of the clamping jaws are smaller than the capacitor, top ends of clamping openings of the clamping jaws are provided with guiding inclined surfaces, and the edge of the capacitor abuts against the guiding inclined surfaces in the longitudinal direction and then the clamping jaws are opened to clamp the capacitor.

Optionally, the clamping table is also provided with a release guiding component corresponding to each set of clamping jaws and a rotary guiding component corresponding to each set of clamping jaws, both the release guiding component and the rotary guiding component are capable of being linked with the driving mechanism to release and rotate the clamping jaws. When the release guiding component of one set of clamping jaws guides the corresponding clamping jaws to release the capacitor, the rotary guiding component of another set of clamping jaws guides the corresponding clamping jaws to rotate the capacitor.

Optionally, the clamping jaw includes slideable sliding rods coaxially arranged in the clamping table in opposite or back directions, opposite ends of the two sliding rods have chucks extending into the placement opening, and a clamping elastic element is disposed between the sliding rods and the clamping table.

Optionally, the rotary guiding component includes a rotary driving plate sliding on the clamping table and a rotary sleeve rotatably arranged on the clamping table, the rotary sleeve is coaxially embedded and slides with the sliding rod, and the rotary sleeve is in transmission connection with the rotary driving plate; when the rotary driving plate moves relative to the clamping table, the rotary sleeve drives the sliding rod to rotate.

Optionally, the release guiding component includes a release driving plate slidably arranged on the clamping table, and the release driving plate is provided with a guiding frame extending along the vertical direction of the release driving plate; the guiding frame is provided with an inclined clamping opening; the outer end of the sliding rod is provided with a limit ring; the guiding frame is clamped on the sliding rod; and the inclined surface of the guiding frame abuts on the limit ring.

Optionally, an elastic connecting element is arranged between the clamping table and the rotary driving plate.

Optionally, the driving mechanism includes a rotary guiding rod abut against the rotary driving plate and a release guiding rod abut against the release driving plate, the rotary guiding rod is provided with a rotary guiding boss, and when the rotary driving plate abuts against the rotary guiding boss, the clamping jaw corresponding to the rotary driving plate rotates the capacitor; the release guiding rod is provided with a release guiding boss, and when the release driving plate abuts on the release guiding boss, the clamping jaw corresponding to the release driving plate releases the capacitor.

A multiple superposition detection method for capacitor appearance defects based on visual detection is also provided by the disclosure, and is carried out on the multiple superposition detection system for capacitor appearance defects based on visual detection. The detection method includes following steps:

step 1, placing capacitors on a clamping mechanism at a feeding end of a conveying mechanism;

step 2, driving the capacitors by the conveying mechanism to sequentially pass through the three detection stations, and photographing all faces of the capacitor by the visual detection camera at the corresponding station; and step 3, determining, by a master controller, whether the capacitors has defects, and screening high-quality capacitors and defective capacitors at a sorting station.

Compared with the prior art, the disclosure has following beneficial effects.

The capacitor is horizontally placed in the clamping mechanism of the conveying mechanism through the negative pressure pick-and-place mechanism, so that when the conveying mechanism drives the capacitors to sequentially penetrate through the three detection stations, the clamping mechanism is matched with the driving mechanism to display the front, back and sides of the capacitors to the visual detection mechanism, the circumferential direction of the capacitors is comprehensively detected, so that the defect part of the capacitors is judged, and the detection precision is effectively improved; detection is carried out simultaneously at different workstations, effectively saving time and enhancing the effectiveness of the detection. The release guiding component and the rotary guiding component can accurately release and rotate the workpiece at the corresponding station, with precise rotation angles that are consistent each time, preventing any instances of incomplete rotation. The structure is simple and does not require complex operations. After the detection is completed, based on the results, the motor of the sorting mechanism can accurately control the separation and storage of high-quality capacitors and defective capacitors, preventing the issue of capacitor accumulation. This ensures the accuracy of the detection results and achieves precise detection and unloading tasks. Consequently, the multiple superposition detection system for capacitor appearance defects based on visual detection, as detailed in the disclosure, offers several key technical benefits: it provides comprehensive detections with high precision and efficiency, features a straightforward structure, ensures accurate rotational control, is easy to operate, delivers reliable results, and effectively prevents product backlog in the production process.

Figure 1:
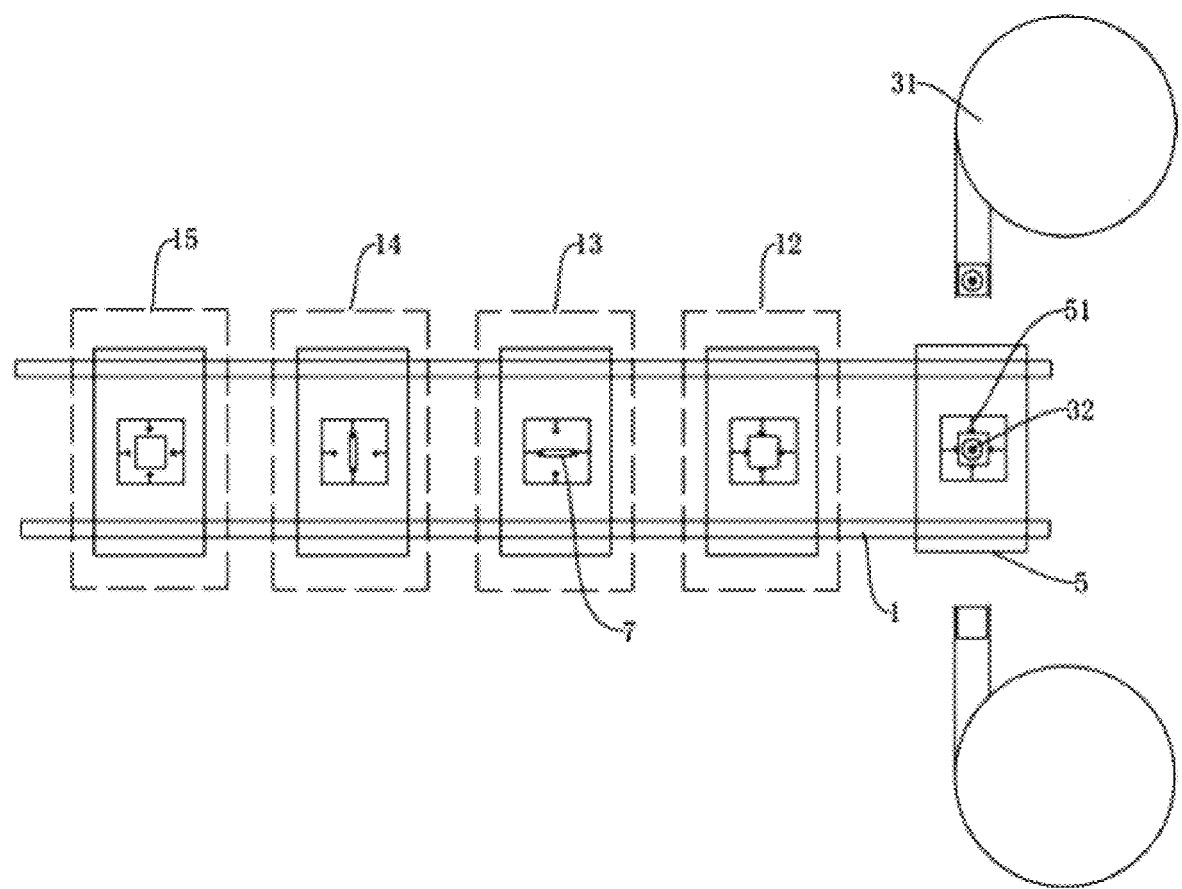
FIG. 1 is a schematic diagram showing a working state of a multiple superposition detection system for capacitor appearance defects based on visual detection.

In the figures: 1. conveying mechanism; 12. front-back detection station; 13. long-side detection station; 14. wide-side detection station; 15. unloading station; 2. visual detection mechanism; 31. vibrating disk; 32. suction rod; 41. sorting plate; 42. servo motor; 5. clamping mechanism; 51. clamping component; 511. sliding rod; 512. chuck; 513. positioning ring; 514. first spring; 52. clamping table; 531. release driving plate; 532. guiding frame; 5321. inclined clamping opening; 533. limit ring; 541. rotary driving plate; 542. rotary sleeve; 543. gear; 544. rack; 545. connecting rod; 546. second spring; 6. driving mechanism; 61. rotary guiding rod; 611. rotary guiding boss; 62. release guiding rod; 621. release guiding boss; and 7. capacitor.

DETAILED DESCRIPTION OF THE EMBODIMENTS

In order to further understand the characteristics, technical means, specific purposes and functions of the present disclosure, the present disclosure is further described in detail with the attached drawings and specific embodiments.

As shown in FIG. 1, FIG. 2, FIG. 3 and FIG. 4, the present disclosure provides:

a multiple superposition detection system for capacitor 7 appearance defects based on visual detection includes a conveying mechanism 1, where the conveying mechanism 1 is sequentially provided with three detection stations and an unloading station 15 along the conveying direction, each detection station is correspondingly provided with a visual detection mechanism 2, a feeding end of the conveying mechanism 1 is provided with a loading mechanism, and the unloading station 15 is provided with a sorting mechanism for collecting defective capacitors 7 and high-quality capacitors 7 respectively. Clamping mechanisms 5 are sequentially arranged on the conveying surface of the conveying mechanism 1. The clamping mechanisms 5 are provided with clamping components 51 capable of clamping the peripheral side of the capacitor 7 in the horizontal direction, and the clamping components 51 are capable of facilitating the rotation of the capacitor 7 along its width or length axis within the clamping mechanisms. The conveying mechanism 1 is further provided with a driving mechanism 6 for guiding the clamping components 51 to drive the capacitor 7 to sequentially rotate at the detection stations to expose the detection surfaces.

The three detection stations are a front-back detection station 12, a long-side detection station 13 and a wide-side detection station 14 in sequence along the conveying direction of the conveying mechanism 1. Each visual detection mechanism 2 includes two visual detection cameras, the two visual detection cameras are respectively arranged at the top and bottom of the detection stations for taking pictures of the upper and lower surfaces of the capacitor 7 at the detection stations and uploading them to the master controller.

Figure 8:
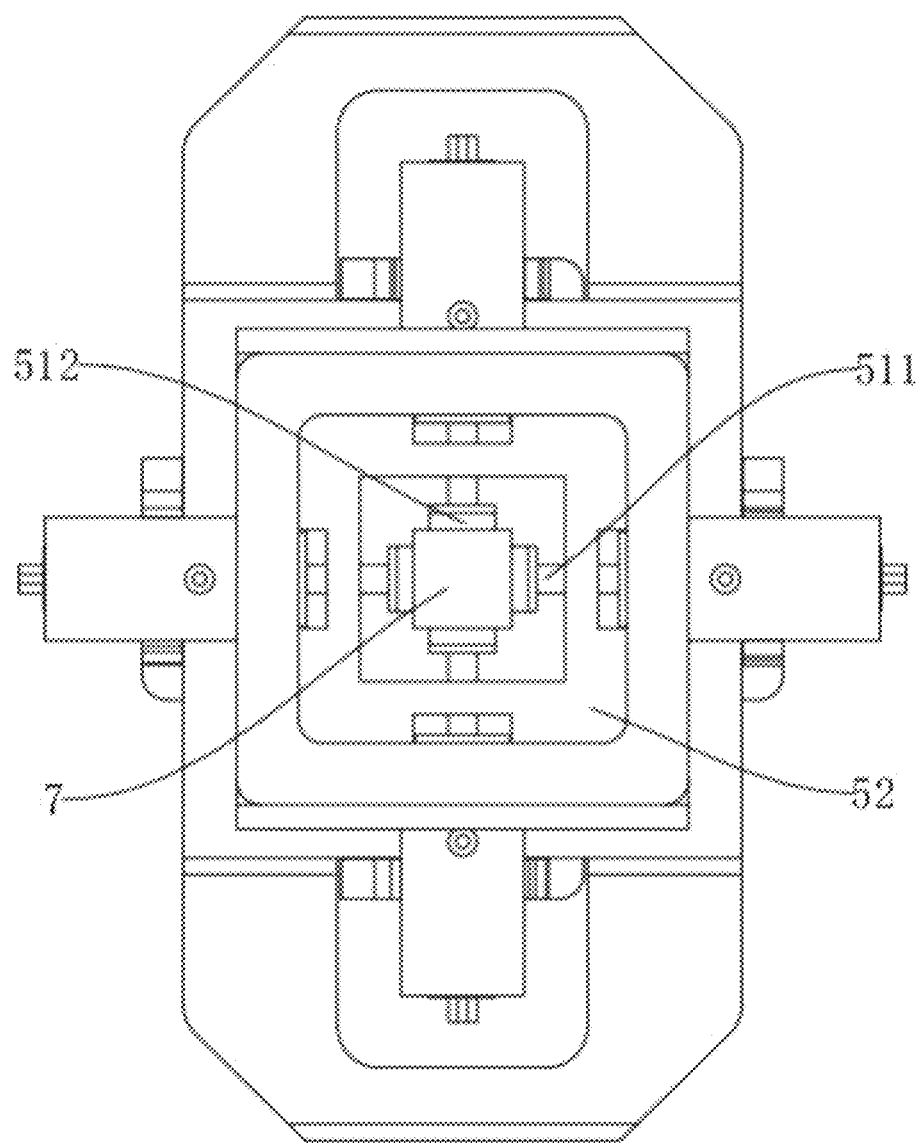
FIG. 8 is a schematic diagram showing the clamping mechanism horizontally clamping the capacitor in the multiple superposition detection system for capacitor appearance defects based on visual detection.
Figure 9:
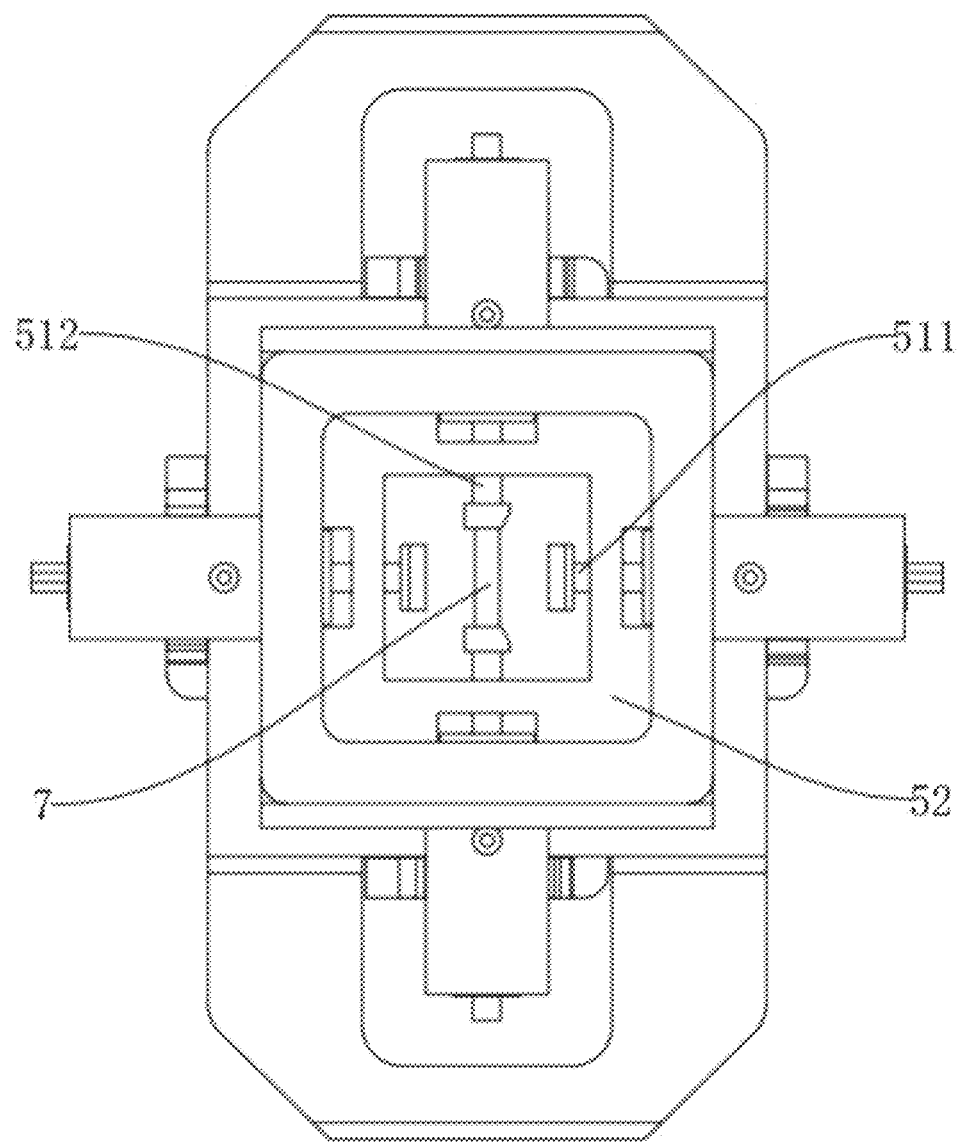
FIG. 9 is a schematic diagram showing the clamping mechanism rotating the capacitor in the width direction in the multiple superposition detection system for capacitor appearance defects based on visual detection.
Figure 10:
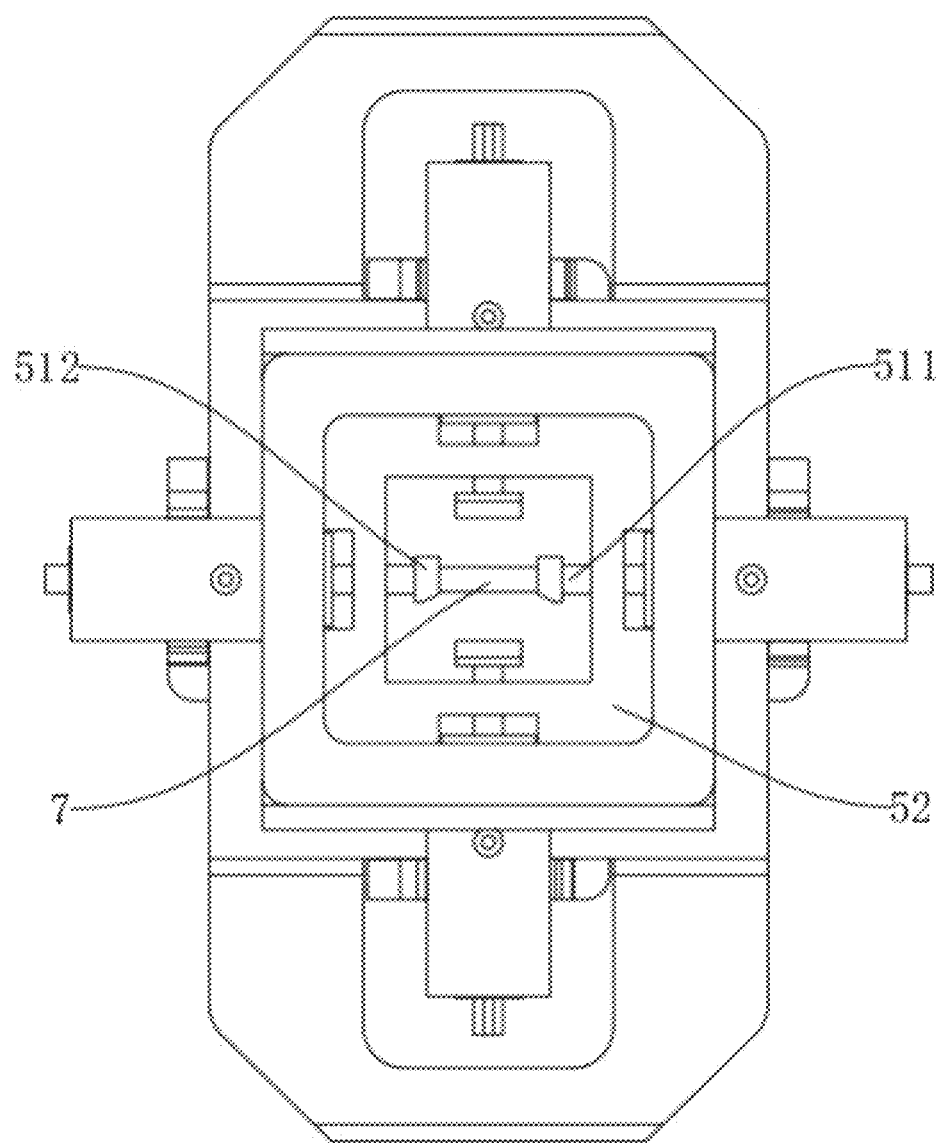
FIG. 10 is a schematic diagram showing the clamping mechanism rotating the capacitor along the length direction in the multiple superposition detection system for capacitor appearance defects based on visual detection.

At the front-back detection station 12, as shown in FIG. 8, the capacitor 7 is in a horizontal state; at the long-side detection station 13, as shown in FIG. 10, the capacitor 7 is rotated by 90 degrees along its length direction; at the wide-side detection station 14, as shown in FIG. 9, the capacitor 7 is rotated by 90 degrees in its width direction.

The sorting mechanism includes a sorting plate 41 and a servo motor 42, where the sorting plate 41 is rotatably arranged at the unloading station 15 of the conveying mechanism 1; one end of the sorting plate 41 is provided with a shaft, the shaft is in transmission connection with the output shaft of the servo motor 42; when the servo motor 42 is started, the sorting plate 41 deflects and tilts at the unloading station 15, so that the sorting plate 41 separates the high-quality capacitors 7 and the defective capacitors 7 and guiding them to different areas.

The loading mechanism includes two vibrating disks 31 arranged at both sides of the feeding end of the conveying mechanism 1, and a negative pressure pick-and-place mechanism arranged at the top of the vibrating disks 31 and the conveying mechanism 1. The negative pressure pick-and-place mechanism has two suction rods 32 capable of sucking the capacitor 7 from the vibrating disks 31 and moving the capacitor 7 in the clamping mechanism 5, so that continuous feeding can be performed for detection.

When in use, the capacitor 7 on one vibrating disk 31 is placed in the clamping mechanism 5 at the feeding end of the conveying mechanism 1 through the negative pressure pick-and-place mechanism, so that the conveying mechanism 1 can drive the capacitor 7 to pass through the front-back detection station 12, the long-side detection station 13 and the wide-side detection station 14 in turn; in the front-back detection station 12, the visual cameras located at the upper and lower portions of the front-back detection station 12 can photograph the capacitor 7, while in the long-side detection station 13 and the wide-side detection station 14, the driving mechanism 6 can guide the capacitor 7 to turn 90 degrees so as to detect the state of each side of the capacitor 7.

In this embodiment, the capacitor 7 is horizontally placed in the clamping mechanism 5 of the conveying mechanism 1 through the negative pressure pick-and-place mechanism, so that when the conveying mechanism 1 drives the capacitors 7 to sequentially penetrate through the three detection stations, the clamping mechanism 5 is matched with the driving mechanism 6 to display the front, back and sides of the capacitors 7 to the visual detection mechanism 2, thus solving the problem that the existing visual appearance detection device is uncapable of effectively detecting all surfaces of the capacitor 7; at the same time, after the detection is completed, the good product capacitors 7 and the defective capacitors 7 can be separately stored through the sorting mechanism, so that the accuracy of the detection structure is ensured, and accurate detection and unloading work is realized.

Figure 5:
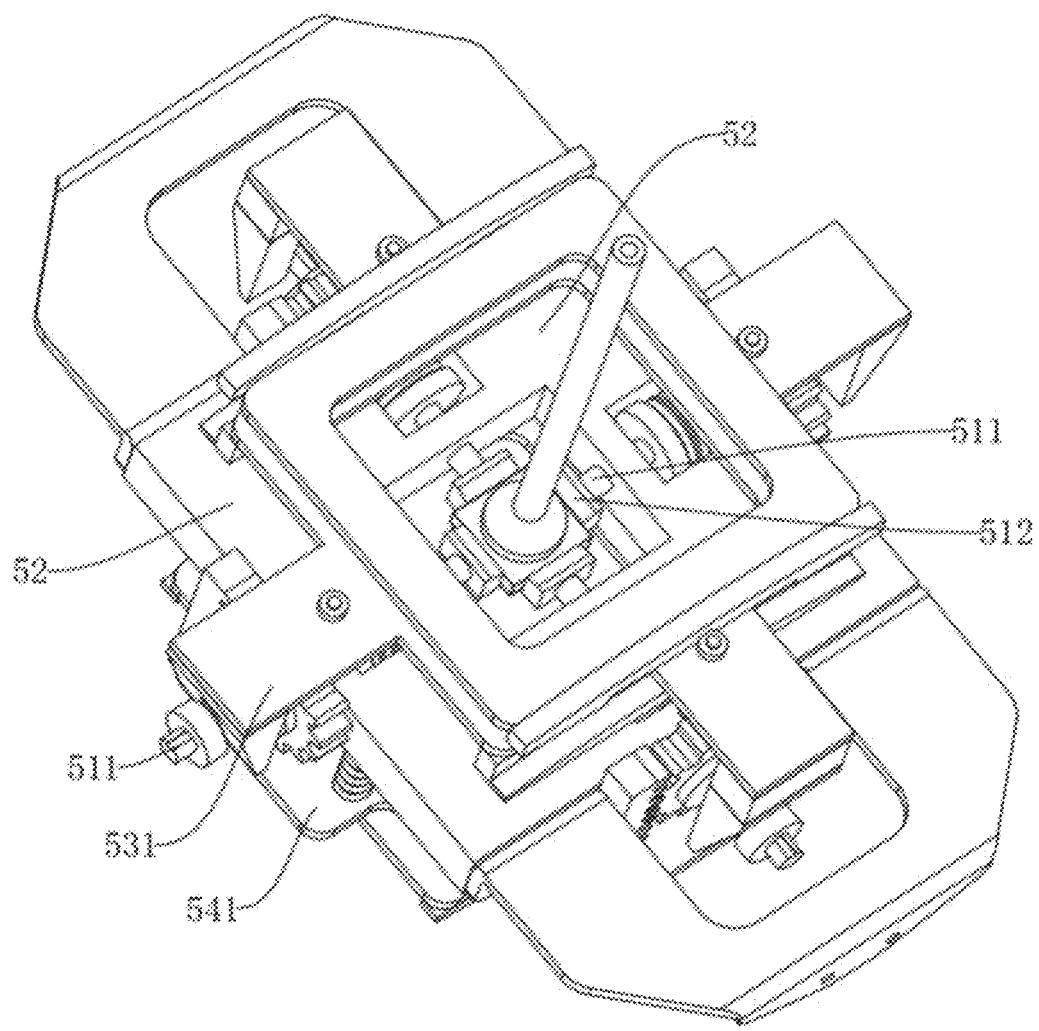
FIG. 5 is a three-dimensional schematic diagram of a clamping mechanism in the multiple superposition detection system for capacitor appearance defects based on visual detection at a first viewing angle.

As shown in FIG. 5, the clamping component 51 has two sets of clamping jaws for releasably clamping the capacitor 7, and the clamping directions of the two sets of clamping jaws are perpendicular to each other in the horizontal direction.

When the capacitor 7 is sucked by the negative pressure pick-and-place mechanism and placed in the clamping mechanism, two sets of clamping jaws respectively clamp the peripheral side of the capacitor 7 in the length and width direction of the capacitor 7; when one set of clamping jaws releases the capacitor 7, and another set of clamping jaws is capable of clamping the capacitor 7 to rotate 90 degrees, detecting whether there is a defect on the peripheral side of the capacitor 7.

As shown in FIG. 5, the clamping mechanism 5 also includes a clamping table 52 with a placement opening in the middle position, and clamping parts of two sets of clamping jaws extend into the placement opening, the clamping distances of the clamping jaws are smaller than the capacitor 7, and top ends of clamping openings of the clamping jaws are provided with guiding inclined surfaces, and the edge of the capacitor 7 abuts against the guiding inclined surfaces in the longitudinal direction and then the clamping jaws are opened to clamp the capacitor 7.

When the negative pressure pick-and-place mechanism absorbs the capacitor 7 and the bottom edge of the capacitor 7 abuts on the guiding inclined surfaces of the clamping jaws, the clamping openings of the two sets of clamping jaws are opened to clamp the capacitor 7, therefore, the capacitor 7 is capable of being fixed in the placement opening of the clamping table 52, and when one set of clamping jaws are opened to loosen the capacitor 7, another set of clamping jaws drives the capacitor 7 to rotate to detect whether the peripheral side of the capacitor 7 is defective.

Figure 4:
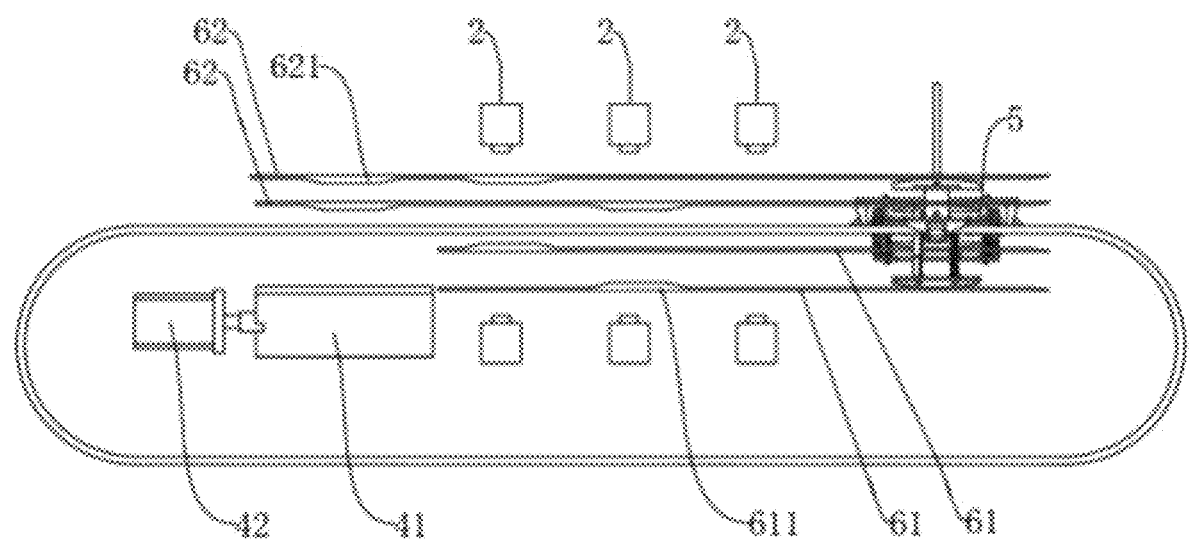
FIG. 4 is a front view of the multiple superposition detection system for capacitor appearance defects based on visual detection.
Figure 6:
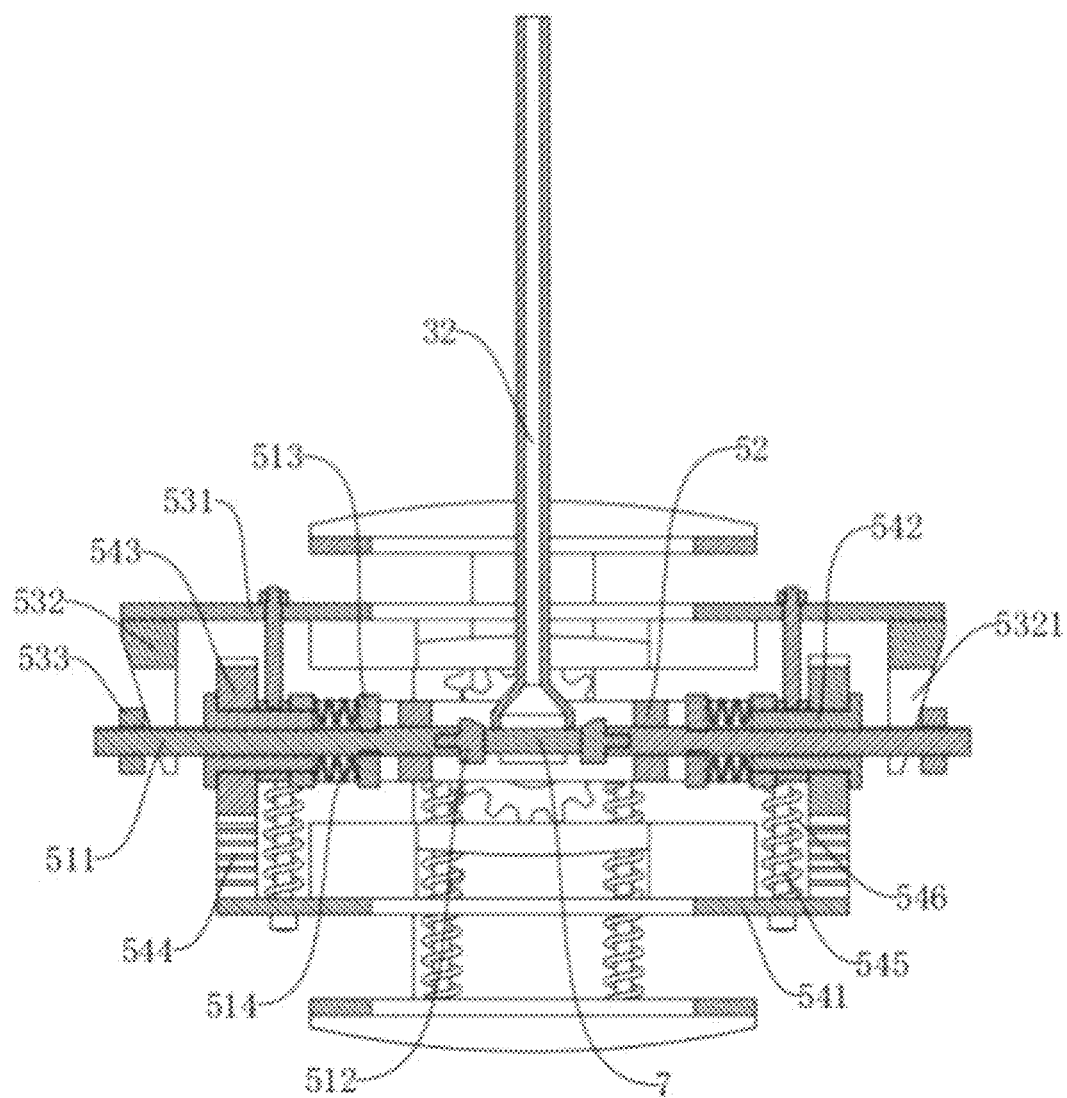
FIG. 6 is a cross-sectional view of the clamping mechanism in the multiple superposition detection system for capacitor appearance defects based on visual detection.
Figure 7:
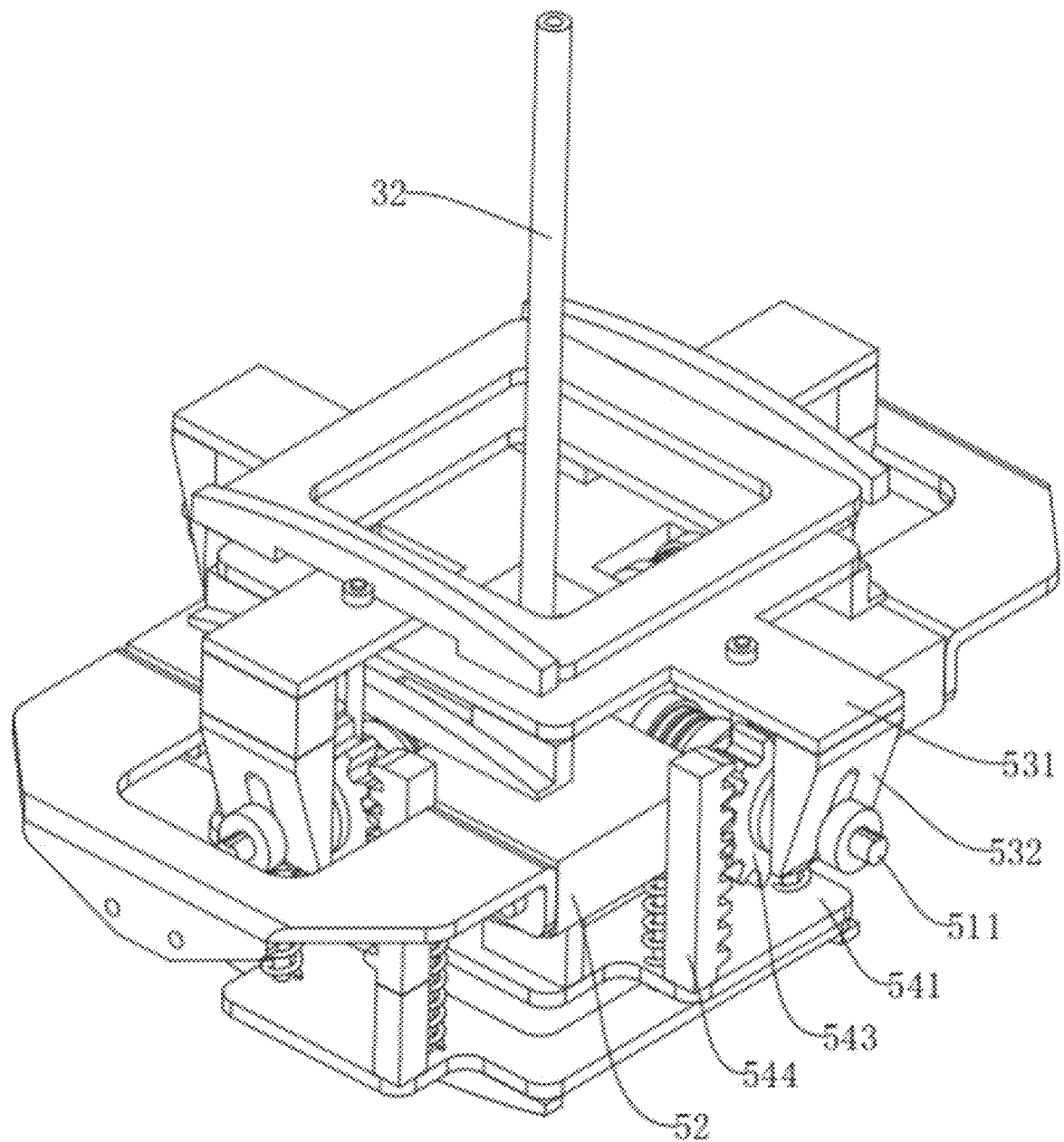
FIG. 7 is a perspective view of the clamping mechanism in the multiple superposition detection system for capacitor appearance defects based on visual detection based on visual detection at a second viewing angle.

As shown in FIG. 4, FIG. 6 and FIG. 7, the clamping table 52 is also provided with a release guiding component corresponding to each set of clamping jaws and a rotary guiding component corresponding to each set of clamping jaws. Both the release guiding component and the rotary guiding component are capable of being linked with the driving mechanism 6 to release and rotate the clamping jaws. When the release guiding component of one set of clamping jaws guides the corresponding clamping jaws to release the capacitor 7, the rotary guiding component of another set of clamping jaws guides the corresponding clamping jaws to rotate the capacitor 7.

Since the clamping table 52 is provided with the release guiding component corresponding to each set of clamping jaws and the rotary guiding component corresponding to each set of clamping jaws, when the conveying mechanism 1 drives the clamping mechanism 5 to pass through the long-side detection station 13 or the wide-side detection station 14, the release guiding component of one set of clamping jaws guides the corresponding clamping jaws to release the capacitor 7, and the rotary guiding component of another set of clamping jaws guides the corresponding clamping jaws to drive the capacitor 7 to rotate by 90 degrees, so as to ensure that the side surfaces of the capacitor 7 can be photographed by the visual detection mechanism 2, thereby ensuring the detection precision of the capacitor 7.

As shown in FIG. 6 and FIG. 7, the clamping jaw includes slideable sliding rods 511 coaxially arranged in the clamping table 52 in opposite or back directions. The opposite ends of the two sliding rods 511 have chucks 512 extending into the placement opening, and a clamping elastic element is arranged between the sliding rods 511 and the clamping table 52.

The clamping table 52 is provided with mounting openings distributed around the placement openings. The clamping elastic element includes a positioning ring 513 and a first spring 514. The positioning ring 513 is coaxially and fixedly arranged on the sliding rod 511, and the first spring 514 is sleeved on the sliding rod 511.

As shown in FIG. 6 and FIG. 7, the rotary guiding component includes a rotary driving plate 541 sliding on the clamping table 52, and a rotary sleeve 542 rotatably arranged on the clamping table 52. The rotary sleeve 542 is coaxially embedded and slides with the sliding rod 511, and the rotary sleeve 542 is in transmission connection with the rotary driving plate 541. When the rotary driving plate 541 moves relative to the clamping table 52, the rotary sleeve 542 drives the sliding rod 511 to rotate.

A gear 543 coaxial with the rotary sleeve 542 is arranged on the rotary sleeve 542, a rack 544 extending in the vertical direction of the rotary driving plate 541 is arranged on the rotary driving plate 541, the rack 544 is meshed with the gear 543, and when the rotary driving plate 541 moves relative to the clamping table 52 under the action of the driving mechanism 6, the rack 544 drives the gear 543 to rotate by a certain angle, so that the clamping jaw can drive the clamped capacitor 7 to rotate by 90 degrees, and the peripheral side condition of the capacitor 7 is exposed.

As shown in FIG. 6, the release guiding component includes a release driving plate 531 slidably arranged on the clamping table 52. The release driving plate 531 is provided with a guiding frame 532 extending in its own vertical direction. The guiding frame 532 has an inclined clamping opening 5321, and the outer end of the sliding rod 511 is provided with a limit ring 533. The guiding frame 532 is clamped on the sliding rod 511, and the inclined surface of the guiding frame 532 abuts against the limit ring 533.

When the release driving plate 531 passes through the detection station, the driving mechanism 6 guides the release driving plate 531 to move relative to the clamping table 52, so that the release driving plate 531 drives the guiding frame 532 to move relative to the clamping table 52, the limiting ring 533 is arranged at the outer end of the sliding rod 511, and the limiting ring 533 abuts against the inclined clamping opening 5321 of the guiding frame 532, so that when the guiding frame 532 moves relative to the clamping table 52, the two sliding rods 511 can release the capacitor 7, and the other two sliding rods 511 continue to clamp the capacitor 7 and drive the capacitor 7 to rotate by 90 degrees, so that the requirement of the peripheral side of the detection capacitor 7 is met.

As shown in FIG. 6, an elastic connecting element is arranged between the clamping table 52 and the rotary driving plate 541.

The elastic connecting element includes a connecting rod 545 and a second spring 546, the connecting rod 545 is mounted in a manner perpendicular to the clamping table 52, the connecting rod 545 slidably penetrates through the rotary driving plate 541, and the second spring 546 is sleeved on the connecting rod 545.

The elastic connecting element is arranged between the clamping table 52 and the rotary driving plate 541, so that when the rotary driving plate 541 moves relative to the clamping table 52, the elastic force needs to be overcome, and when the rotary driving plate 541 is separated from the detection station, the rotary driving plate 541 is reset under the action of elastic force, so that the requirement of the continuous rotation detection capacitor 7 is met.

As shown in FIG. 4 and FIG. 6, the driving mechanism 6 includes a rotary guiding rod 61 abut against the rotary driving plate 541 and a release guiding rod 62 abut against the release driving plate 531. The rotary guiding rod 61 is provided with a rotary guiding boss 611, and when the rotary driving plate 541 abuts against the rotary guiding boss 611, the clamping jaw corresponding to the rotary driving plate 541 rotates the capacitor 7; the release guiding rod 62 is provided with a release guiding boss 621. When the release driving plate 531 abuts on the release guiding boss 621, the clamping jaw corresponding to the release driving plate 531 releases the capacitor 7.

When a set of clamping jaws pass through the long-side detection station 13 or the wide-side detection station 14, the release driving plate 531 corresponding to the set of clamping jaws slides from the release guiding rod 62 to the release guiding boss 621, that is, the release driving plate 531 moves relative to the clamping table 52, so that the set of clamping jaw release capacitors 7 can slide from the rotation guide rod 61 to the rotation guide boss 611, that is, the rotation driving plate 541 moves relative to the clamping table 52, so that the set of clamping jaws can clamp the capacitor 7 to rotate, and the long side face detection station 13 or the wide side face detection station 14 shoots the long side face or the wide side face of the capacitor 7, and release guiding bosses 621 corresponding to the two sets of release driving plates 531 are arranged on the release guiding rod 62 at the unloading station 15, so that the two sets of release driving plates 531 corresponding to the two sets of clamping jaws can move relative to the clamping table 52, and the two sets of clamping jaws release the capacitor 7 at the same time, so that the good product capacitor 7 and the defective product capacitor 7 are stored separately.

Figure 2:
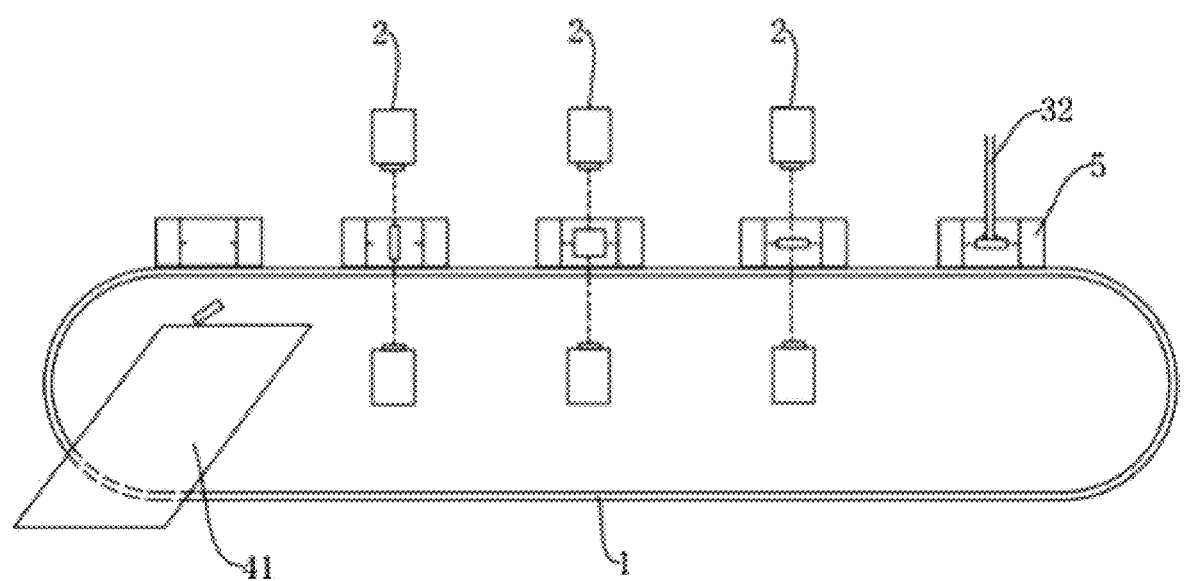
FIG. 2 is another schematic diagram showing a working state of the multiple superposition detection system for capacitor appearance defects based on visual detection.
Figure 3:
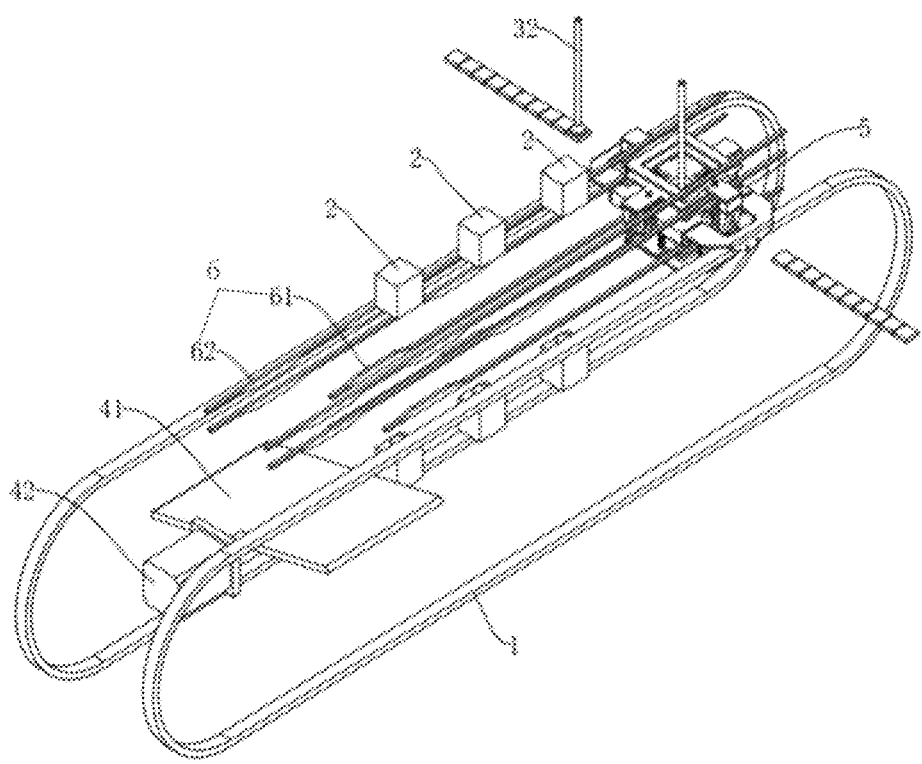
FIG. 3 is a perspective view of the multiple superposition detection system for capacitor appearance defects based on visual detection.

As shown in FIG. 1 and FIG. 2, a multiple superposition detection method for capacitor 7 appearance defects based on visual detection is carried out on the multiple superposition detection system for capacitor 7 appearance defects based on visual detection, and the detection method includes the following steps:

step 1, placing the capacitor 7 on a clamping mechanism at a feeding end of a conveying mechanism 5;

step 2, driving the capacitor 7 by the conveying mechanism 1 to sequentially pass through the three detection stations, and photographing all faces of the capacitor 7 by the visual detection camera at the corresponding station; and step 3, determining, by a master controller, whether the capacitor 7 has defects, and screening high-quality capacitors 7 and defective capacitors 7 at a sorting station.

The above embodiments only express one or several embodiments of the present disclosure, and their descriptions are more specific and detailed, but they cannot be understood as limiting the scope of the present disclosure. It should be pointed out that for those skilled in the art, without departing from the concept of the disclosure, a number of variations and improvements can be made, which are within the scope of protection of the disclosure. Therefore, the scope of protection of the present disclosure should be based on the appended claims.

What is claimed is:

1. A multiple superposition detection system for capacitor appearance defects based on visual detection, comprising a conveying mechanism, wherein the conveying mechanism is sequentially provided with three detection stations and an unloading station along a conveying direction, each detection station is correspondingly provided with a visual detection mechanism, a feeding end of the conveying mechanism is provided with a loading mechanism, and the unloading station is provided with a distributing mechanism for collecting defective capacitors and high-quality capacitors respectively; clamping mechanisms are sequentially arranged on a conveying surface of the conveying mechanism, and the clamping mechanisms are provided with clamping components capable of clamping a peripheral side of a capacitor in a horizontal direction, the clamping components are capable of facilitating a rotation of the capacitor along its width or length axis within the clamping mechanisms; the conveying mechanism is further provided with a driving mechanism for guiding the clamping components to drive the capacitor to sequentially rotate on the three detection stations to expose detection surfaces;

the clamping component is provided with two sets of clamping jaws for releasably clamping the capacitor, and clamping directions of the two sets of clamping jaws are perpendicular to each other in the horizontal direction;

the clamping mechanism further comprises a clamping table with a placement opening in a middle position, and clamping parts of the two sets of clamping jaws extend into the placement opening, clamping distances of the clamping jaws are smaller than the capacitor, top ends of clamping openings of the clamping jaws are provided with guiding inclined surfaces, and an edge of the capacitor abuts against the guiding inclined surfaces in a longitudinal direction and then the clamping jaws are opened to clamp the capacitor;

the clamping table is also provided with a release guiding component corresponding to each set of clamping jaws and a rotary guiding component corresponding to each set of clamping jaws, both the release guiding component and the rotary guiding component are capable of being linked with the driving mechanism to release and rotate the clamping jaws; when the release guiding component of one set of clamping jaws guides the corresponding clamping jaws to release the capacitor, the rotary guiding component of another set of clamping jaws guides the corresponding clamping jaws to rotate the capacitor;

the clamping jaw comprises slideable sliding rods coaxially arranged in the clamping table in opposite or back directions, opposite ends of the two sliding rods have chucks extending into the placement opening, and a clamping elastic element is disposed between the sliding rods and the clamping table;

the rotary guiding component comprises a rotary driving plate sliding on the clamping table and a rotary sleeve rotatably arranged on the clamping table, the rotary sleeve is coaxially embedded and slides with the sliding rod, and the rotary sleeve is in transmission connection with the rotary driving plate; when the rotary driving plate moves relative to the clamping table, the rotary sleeve drives the sliding rod to rotate;

the release guiding component comprises a release driving plate slidably arranged on the clamping table, and the release driving plate is provided with a guiding frame extending along a vertical direction of the release driving plate; the guiding frame is provided with an inclined clamping opening; an outer end of the sliding rod is provided with a limit ring; the guiding frame is clamped on the sliding rod; and an inclined surface of the guiding frame abuts on the limit ring;

the driving mechanism comprises a rotary guiding rod abut against the rotary driving plate and a release guiding rod abut against the release driving plate, the rotary guiding rod is provided with a rotary guiding boss, and when the rotary driving plate abuts against the rotary guiding boss, the clamping jaw corresponding to the rotary driving plate rotates the capacitor;

the release guiding rod is provided with a release guiding boss, and when the release driving plate abuts on the release guiding boss, the clamping jaw corresponding to the release driving plate releases the capacitor.

2. The multiple superposition detection system for capacitor appearance defects based on visual detection according to claim 1, wherein an elastic connecting element is arranged between the clamping table and the rotary driving plate.

3. A multiple superposition detection method for capacitor appearance defects based on visual detection, implemented by the multiple superposition detection system for capacitor appearance defects based on visual detection according to claim 1, the method comprising the following steps:

step 1, placing capacitors on the clamping mechanisms at the feeding end of the conveying mechanism;

step 2, driving the capacitors by the conveying mechanism to sequentially pass through the three detection stations, and photographing all faces of each of the capacitors by a visual detection camera at a corresponding station of the three detection stations; and step 3, determining, by a master controller, whether the capacitors have defects, and screening the high-quality capacitors and the defective capacitors at a sorting station.

* * * * *